US011315921B2

(12) United States Patent
Ho et al.

(10) Patent No.: US 11,315,921 B2
(45) Date of Patent: Apr. 26, 2022

(54) INTEGRATED CIRCUIT WITH ANTI-PUNCH THROUGH CONTROL

(71) Applicant: Taiwan Semiconductor Manufacturing Co., Ltd., Hsinchu (TW)

(72) Inventors: Yi-Chen Ho, Hsinchu (TW); Chien Lin, Hsinchu (TW); Tzu-Wei Lin, Hsinchu (TW); Ju Ru Hsieh, Hsinchu (TW); Ching-Lun Lai, Taichung (TW); Ming-Kai Lo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 19 days.

(21) Appl. No.: 16/721,640

(22) Filed: Dec. 19, 2019

(65) Prior Publication Data

US 2021/0193653 A1 Jun. 24, 2021

(51) Int. Cl.
*H01L 27/08* (2006.01)
*H01L 27/088* (2006.01)
*H01L 27/108* (2006.01)
*H01L 27/092* (2006.01)

(52) U.S. Cl.
CPC ...... *H01L 27/0886* (2013.01); *H01L 27/0924* (2013.01); *H01L 27/10826* (2013.01)

(58) Field of Classification Search
CPC combination set(s) only.
See application file for complete search history.

(56) References Cited

U.S. PATENT DOCUMENTS

2014/0252426 A1\* 9/2014 Huang ............... H01L 29/0607
257/288
2016/0336319 A1\* 11/2016 Yang ............... H01L 21/823807

\* cited by examiner

*Primary Examiner* — Moin M Rahman
(74) *Attorney, Agent, or Firm* — Seed IP Law Group LLP

(57) ABSTRACT

An integrated circuit die includes a FinFET transistor. The FinFET transistor includes an anti-punch through region below a channel region. Undesirable dopants are removed from the anti-punch through region during formation of the source and drain regions. When source and drain recesses are formed, a layer of dielectric material is deposited in the recesses. An annealing process is then performed. Undesirable dopants diffuse from the anti-punch through region into the layer of dielectric material during the annealing process. The layer of dielectric material is then removed. The source and drain regions are then formed by depositing semiconductor material in the recesses.

19 Claims, 19 Drawing Sheets

INTEGRATED CIRCUIT WITH ANTI-PUNCH THROUGH CONTROL

BACKGROUND

Technical Field

The present disclosure relates to the field of integrated circuits. The present disclosure relates more particularly to integrated circuits including FinFET transistors.

Description of the Related Art

FinFET transistors typically include doped anti-punch through regions to reduce undesirable short channel effects. However, some undesirable dopants may migrate into the channel region from the anti-punch through region. These undesirable dopants in the channel region can adversely impact the performance of the transistor. Accordingly, while anti-punch through regions are beneficial to the operation of FinFET transistors, traditional anti-punch through regions also have some drawbacks for FinFET performance.

DETAILED DESCRIPTION

Figure 1:
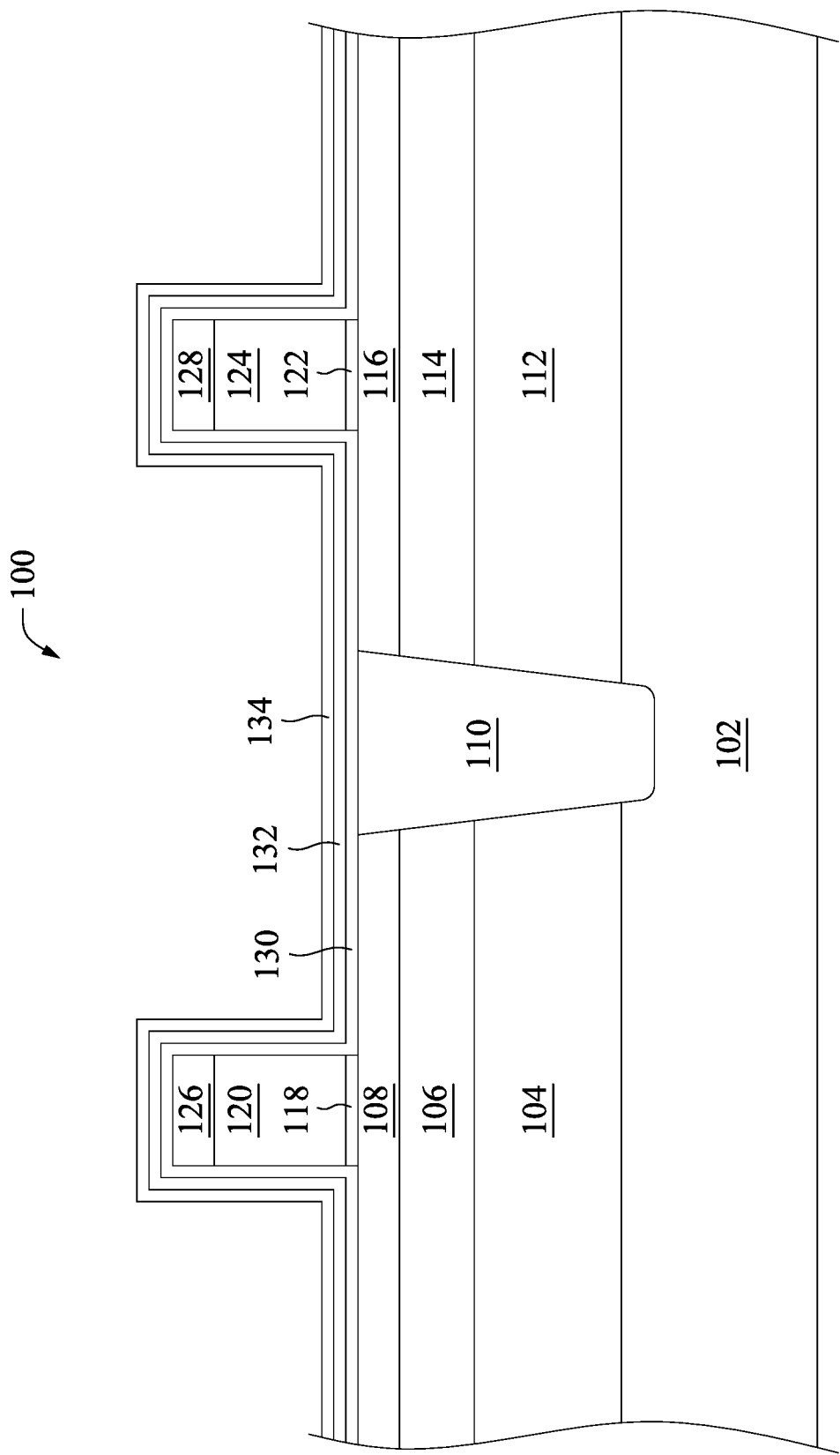
FIGS. 1-17 illustrate cross-sectional views of an integrated circuit die at successive stages of fabrication, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a cross-sectional view of a portion of an integrated circuit die 100, according to one embodiment. The integrated circuit die 100 is at an intermediate stage of fabrication. When fabrication of the integrated circuit die 100 is complete, the integrated circuit die 100 will include an array of N-type and P-type FinFET transistors.

The integrated circuit die 100 includes a bulk semiconductor substrate 102. The bulk semiconductor substrate 102 can include monocrystalline silicon. The bulk semiconductor substrate 102 can include semiconductor materials other than monocrystalline silicon without departing from the scope of the present disclosure.

In one embodiment the integrated circuit die 100 includes a silicon on insulator (SOI) substrate. In this case, a layer of dielectric material (not shown), such as silicon dioxide, is positioned below the semiconductor substrate 102. A layer of semiconductor material is positioned below the layer of dielectric material. This silicon on insulator configuration is utilized to reduce parasitic capacitances and short channel effects in transistors. Accordingly, though not explicitly shown in the Figures, the integrated circuit die 100 can utilize a silicon on insulator substrate.

The integrated circuit die 100 includes a P-well region 104. The P-well region 104 is utilized for formation of N-channel transistors. While the Figures illustrate formation of only a single N-channel transistor at the P-well region 104, those of skill in the art will recognize, in light of the present disclosure, that the integrated circuit die 100 can include a large number of N-channel transistors formed in conjunction with the P-well region 104.

The P-well region 104 includes P-type dopant. In an example in which the semiconductor substrate 102 is monocrystalline silicon, the P-type dopant atoms can include boron atoms. The dopant concentration of the P-well region 104 is between $1E15/cm^3$ and $1E17/cm^3$. The P-well region 104 can include other dopant concentrations and other types of dopants than those described herein without departing from the scope of the present disclosure.

In one embodiment, P-well region 104 is part of the semiconductor substrate 102. In the example of which the semiconductor substrate 102 includes monocrystalline silicon, the P-well region 104 also includes monocrystalline silicon doped with P-type dopant atoms. The P-well region 104 includes the same semiconductor material as the semiconductor substrate 102, with the addition of dopant atoms.

The integrated circuit die 100 includes an N-well region 112. The N-well region 112 is utilized for formation of P-channel transistors. While the Figures illustrate formation of only a single P-channel transistor at the N-well region 106, those of skill in the art will recognize, in light of the present disclosure, that in practice the integrated circuit die 100 can include a large number of P-channel transistors formed in conjunction with the N-well region 112.

The N-well region 112 includes N-type dopant atoms. In an example in which the semiconductor substrate 102 is monocrystalline silicon, the N-type dopant atoms can include Phosphorous atoms. The dopant concentration of the N-well region 112 is between $1E15/cm^3$ and $1E17/cm^3$. The N-well region 112 can include other dopant concentrations and other types of dopants than those described herein without departing from the scope of the present disclosure.

In one embodiment, N-well region 112 is part of the semiconductor substrate 102. In the example of which the semiconductor substrate 102 includes monocrystalline silicon, the N-well region 112 also includes monocrystalline silicon doped with N-type dopant atoms. The N-well region 112 includes the same semiconductor material as the semiconductor substrate 102, with the addition of dopant atoms.

The semiconductor substrate 102 is doped with P-type dopant atoms. For example, during semiconductor substrate 102 can be doped with P-type dopant atoms in-situ during growth of the semiconductor substrate 102. In this case, the P-well region 104 can include all of the semiconductor substrate 102 down to the dielectric layer of the SOI configuration. The N-well region 112 can be formed during a separate doping process in which N-type dopant ions are implanted in the semiconductor substrate 112 at a selected depth with a selected concentration.

The integrated circuit die 100 includes an anti-punch through region 106 formed above or in the P-well region 104. The anti-punch through region 106 helps to reduce a drain-induced barrier lowering (DIBL) effect. As the channel length of FinFET transistors decreases, DIBL increases. DIBL can result in short circuits between the source and drain of the FinFET transistors. The presence of the anti-punch through region 106 helps to reduce DIBL and the corresponding short circuits between the source and drain of the FinFET transistors.

The anti-punch through region 106 is a P-type anti-punch through region for reducing punch through in N-channel transistors. The P-type anti-punch through region 106 can be formed by doping the selected area with P-type dopant including boron (B) and/or boron fluorine (BF2). The P-type dopant can be implanted during an ion implantation process with a power range from about 3 keV to about 7 keV. Alternatively, the P-type dopant can be implanted in situ during an epitaxial growth of the region of the semiconductor substrate 102 corresponding to the anti-punch through region 106. Other types of dopant, and other doping processes can be utilized to form the anti-punch through region 106 without departing from the scope of the present disclosure.

In one embodiment, a barrier layer can be formed on top of the anti-punch through region 106 to inhibit diffusion of the anti-punch through region 106 into a channel region 108. The barrier layer can include silicon carbide or other suitable periods.

The integrated circuit die 100 includes an anti-punch through region 114 formed above or in the N-well region 112. The anti-punch through region 114 helps to reduce drain-induced barrier lowering (DIBL) effect, as described previously.

The anti-punch through region 114 is an N-type anti-punch through region for reducing DIBL for P-channel transistors. The N-type anti-punch through region 114 can be formed by doping the selected area with N-type dopant including arsenic (As), phosphorus (P), or antimony (Sb). The doping process can also result in the presence of hydrogen H in the anti-punch through region 114. The N-type dopant can be implanted during an ion implantation process with a power range from about 3 keV to about 7 keV. Alternatively, the N-type dopant can be implanted in situ during an epitaxial growth of the region of the semiconductor substrate 102 corresponding to the anti-punch through region 114. Other types of dopant, and other dopant processes can be utilized to form the anti-punch through region 114 without departing from the scope of the present disclosure.

In one embodiment, a barrier layer can be formed on top of the anti-punch through region 114 to inhibit diffusion of the anti-punch through region 106 into a channel region 116. The barrier layer can include silicon carbide or other suitable materials.

The integrated circuit die 100 includes a channel region 108. The channel region 108 includes a monocrystalline semiconductor material. The monocrystalline semiconductor material can include monocrystalline silicon. Alternatively, the channel region 108 can include a monocrystalline semiconductor material other than silicon without departing the scope of the present disclosure. Additionally, the channel region 108 can include a different monocrystalline semiconductor material than the anti-punch through region 106. The channel region 108 will correspond to the channel region of N-channel transistors formed in conjunction with P-well region 104, as will be described in more detail below.

The channel region 108 can be formed via an epitaxial growth after formation of the anti-punch through region 106. Alternatively, the channel region one can be formed in a same epitaxial growth process as the anti-punch through region 106 but without the dopant of the anti-punch through region 106.

The integrated circuit die 100 includes a channel region 116. The channel region 116 includes a monocrystalline semiconductor material. The monocrystalline semiconductor material can include monocrystalline silicon. Alternatively, the channel region 116 can include a monocrystalline semiconductor material other than silicon without departing the scope of the present disclosure. Additionally, the channel region 116 can include a different monocrystalline semiconductor material than the anti-punch through region 114. The channel region 116 will correspond to the channel region of P-channel transistors formed in conjunction with the N-well region 112.

The channel region 116 can be formed via an epitaxial growth after formation of the anti-punch through region 108. Alternatively, the channel region one can be formed in a same epitaxial growth process as the anti-punch through region 108 but without the dopant of the anti-punch through region 108.

The integrated circuit die 100 includes trench isolation region 110. The trench isolation region 110 electrically isolates the N-well region 112 from the P-well region 104. Additionally or alternatively, the trench isolation 110 can separate N-channel transistors regions from P-channel transistors regions. The trench isolation region 110 can extend to a depth below the N-well 112. In one embodiment, the trench isolation region 110 can extend all the way to an insulator layer of the silicon on insulator substrate. The trench isolation region 110 can include silicon dioxide. The trench isolation region 110 can include other materials, shapes, and dimensions without departing from the scope of the present disclosure.

The integrated circuit die 100 includes a gate dielectric layer 118 positioned on the channel region 108. The gate dielectric layer 118 can include dielectric materials such as silicon oxide, silicon nitride, silicon oxynitride, dielectric materials with high dielectric constants (high-K dielectric materials), or combinations thereof. High-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide. Other suitable dielectric materials for the gate dielectric 118 can be utilized without departing the scope of the present disclosure.

The integrated circuit die 100 includes a gate electrode 120. The gate electrode 120 may include polysilicon or metal. Metals for the gate electrode 120 can include tantalum nitride, nickel silicon, cobalt silicon, molybdenum, copper, tungsten, alumina, cobalt, zirconium, platinum, or other suitable materials. Other materials can be used for the gate electrode 120 without departing from the scope of the present disclosure.

The integrated circuit die 100 includes a hard mask layer 126 positioned on the gate electrode 120. The hard mask layer 126 can include silicon oxide, silicon nitride, or silicon oxynitride. Other materials can be used for the hard mask layer 126 without departing from the scope of the present disclosure. The hard mask layer 126 is utilized to pattern the gate electrode 120 during processing steps leading to the integrated circuit die 100 as shown in FIG. 1.

The integrated circuit die 100 includes a gate dielectric layer 122 positioned on the channel region 108. The gate dielectric layer 122 can include dielectric materials such as silicon oxide, silicon nitride, silicon oxynitride, dielectric materials with high dielectric constants (high-K dielectric materials), or combinations thereof. High-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide. Other suitable dielectric materials for the gate dielectric 122 can be utilized without departing the scope of the present disclosure.

The integrated circuit die 100 includes a gate electrode 124. The gate electrode 124 may include polysilicon or metal. Metals for the gate electrode 124 can include tantalum nitride, nickel silicon, cobalt silicon, molybdenum, copper, tungsten, alumina, cobalt, zirconium, platinum, or other suitable materials. Other materials can be used for the gate electrode 124 without departing from the scope of the present disclosure.

The integrated circuit die 100 includes a hard mask layer 128 positioned on the gate electrode 124. The hard mask layer 128 can include silicon oxide, silicon nitride, or silicon oxynitride. Other materials can be used for the hard mask layer 128 without departing from the scope of the present disclosure. The hard mask layer 128 is utilized to pattern the gate electrode 124 during processing steps leading to the integrated circuit die 100 as shown in FIG. 1.

The integrated circuit die includes spacer layers 130, 132, and 134. The spacer layers 130, 132, 134 are dielectric layers for forming sidewall spacers for the gate electrodes 120, 124, as will be described in more detail below. The spacer layers 130, 132, 134 can include silicon oxide, silicon nitride, and silicon oxynitride. The spacer layers can include more or fewer than three layers and can include other materials without departing from the scope of the present disclosure.

Though not apparent in FIG. 1, the channel regions 108, 116 and the anti-punch through regions 106, 114 can be formed in a semiconductor fin that protrudes from the semiconductor substrate 102. The semiconductor fin is more apparent in the perspective view of FIG. 18.

Figure 2:
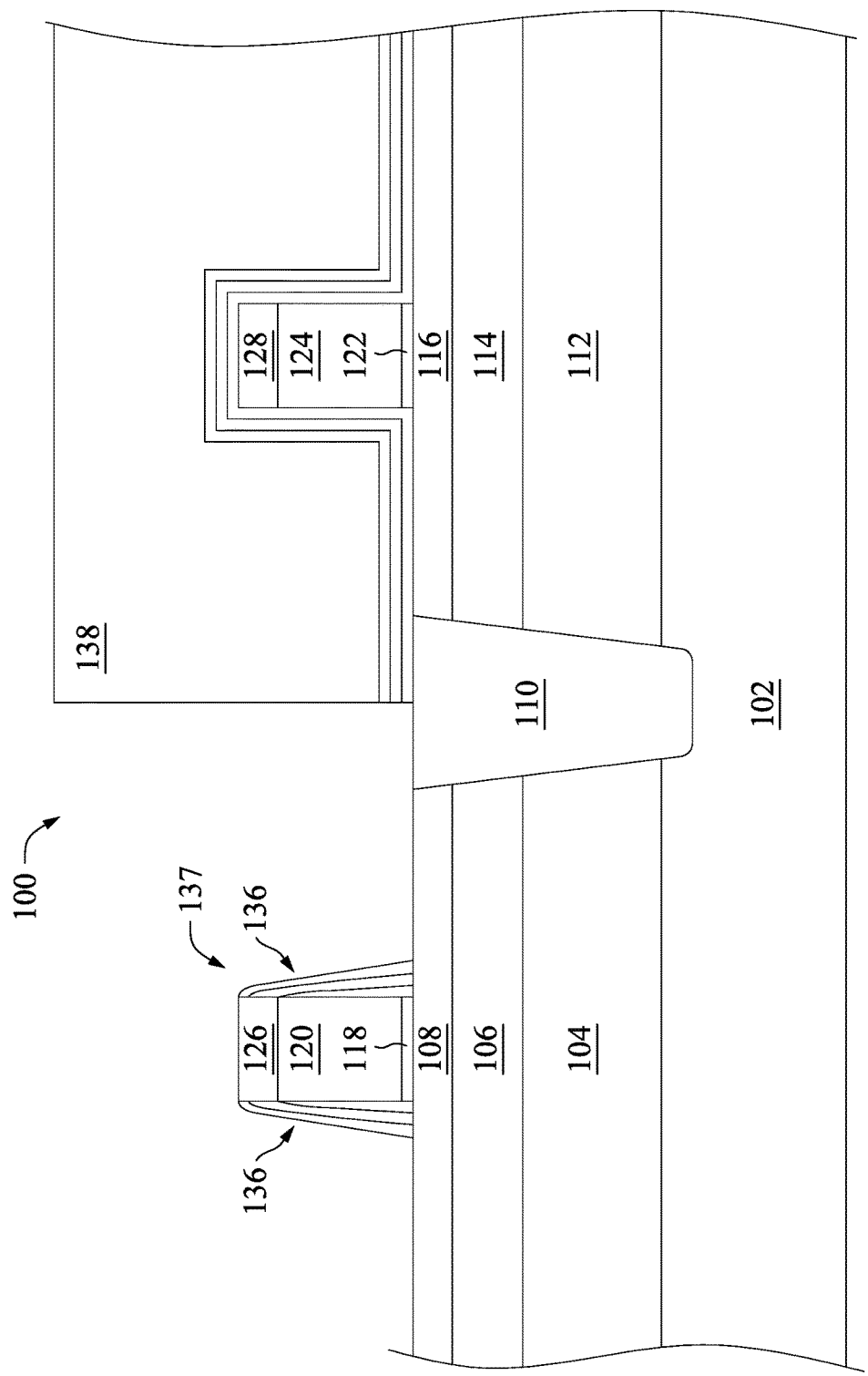

FIG. 2 is a cross-section of the integrated circuit die 100 at an intermediate stage of processing, according to one embodiment. In FIG. 2, a mask 138 is formed on top of the top spacer layer 134 over the portion of the integrated circuit die 100 corresponding to the P-channel FinFET transistors. The mask 138 can be formed using common photolithography techniques including depositing a layer of photoresist, exposing the photoresist to light in the presence of a photolithography mask, and removing non-hardened portions of the photoresist. Other suitable processes and materials can be used to form the mask 138 without departing from the scope of the present disclosure.

A sidewall spacer 136 is formed on sidewalls of the gate electrode 120. The sidewall spacer is formed by etching the exposed portions of the spacer layers 130, 132, and 134. The etching process completely removes the spacer layers 130, 132, and 134 at those exposed locations where the spacer layers 130, 132, 134 were thinnest in the vertical direction. The spacer layers 130, 132, and 134 are not etched directly below the mask 138.

The sidewall spacer 136 is formed by using an anisotropic etching process. The anisotropic etching process selectively etches in the downward direction. The result is that the spacer layers are not significantly etched from the sidewalls of the gate electrode because the spacer layers 130, 132, and 134 are vertically thick along the sidewalls of the gate electrode 120. Accordingly, after the etching process, the sidewall spacers 136 remain as shown in FIG. 2.

A gate stack 137 includes the gate dielectric 118, the gate electrode 120, the hard mask 126, and the sidewall spacer 136. The gate stack 137 wraps around a semiconductor fin, as shown in more detail in relation to FIG. 18.

Figure 3:
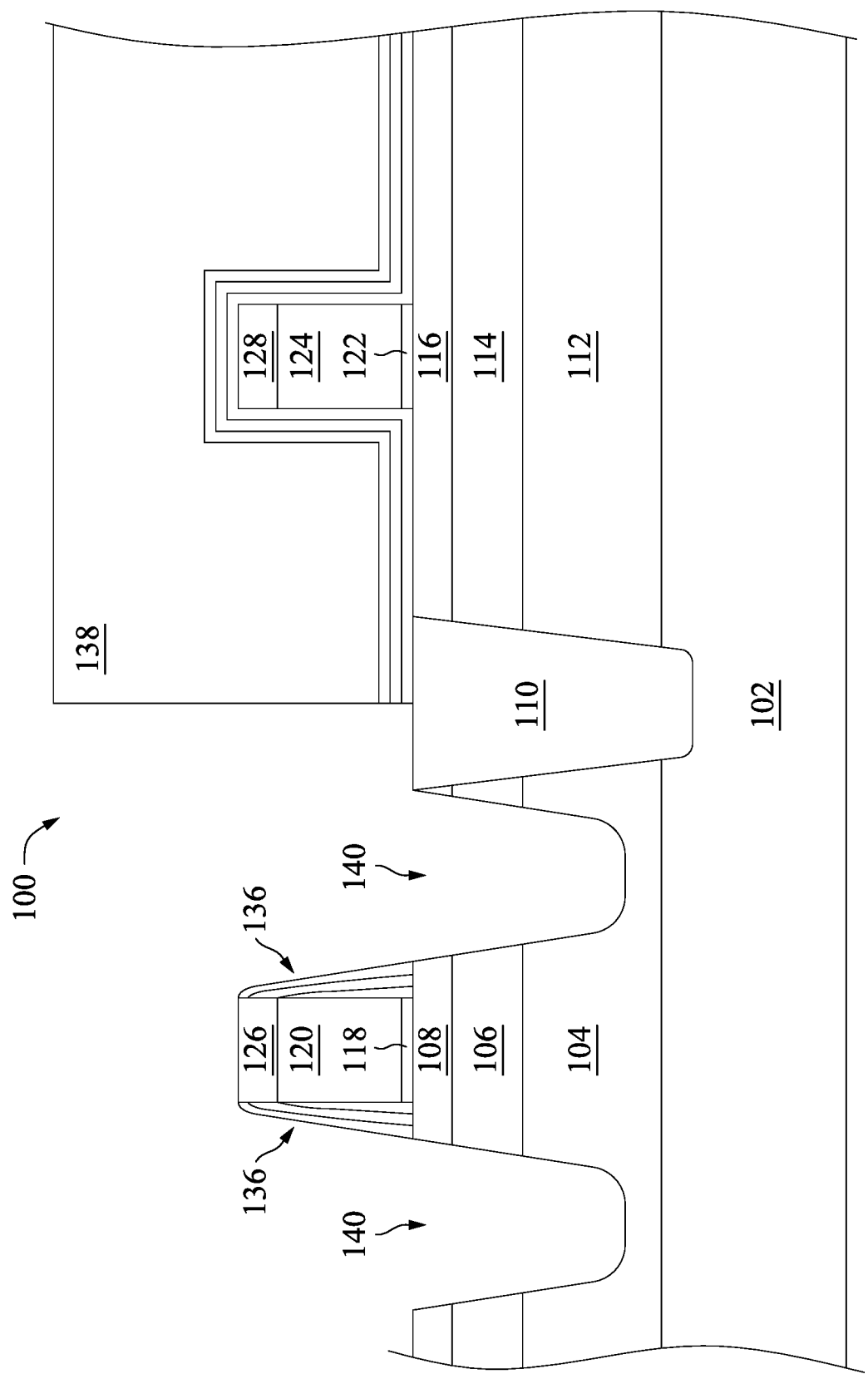

FIG. 3 is a cross-section of the integrated circuit die 100 at an intermediate stage of processing, according to one embodiment. In FIG. 3, source and drain recesses 140 are formed in the semiconductor material in the P-well region 104, the anti-punch through region 106, and the channel region 108. As will be described in more detail below, the source and drain recesses 140 will be utilized to form source and drain regions for an N-channel FinFET transistor.

The etching process for forming the source and drain recesses 140 selectively etches the semiconductor material associated with the various semiconductor regions 104, 106, 108 with respect to the trench isolation region 110, sidewall spacer 136, the hard mask 126, and the mask 138. In other words, the etching process etches the semiconductor material associated with the channel region 108, the anti-punch through region 106, and the P-well region 104 at a significantly higher rate than the materials of the sidewall spacer 136, the hard mask 126, and the mask 138. The etching process can include a wet etch or dry etch. Accordingly, the chemistry of the etchant selectively etches the semiconductor material of the various semiconductor regions 104, 106, 108.

In one embodiment, the etching process for forming the source and drain recesses 140 is an isotropic etch. The isotropic etch etches in all directions substantially at the same rate. Accordingly, the bottom of the recesses 140 will have a semicircular shape. Alternatively, the etching process for forming the source and drain recesses 140 can include an anisotropic etch that selectively etches in the downward direction a significantly higher rate than in other directions. In this case, the recesses 140 would have substantially vertical walls and a substantially flat bottom. The etching process for forming the source and drain recesses can include one or more of a wet etch, a dry etch, or ion beam etching. Those of skill in the art will recognize, in light of will recognize, in light of present disclosure, that other etching processes can be utilized without departing from the scope of the present disclosure.

In one embodiment, the recesses 140 do not extend below the anti-punch through region 106. In this case, the anti-punch through region 106 entirely separates the recesses 140 from the P-well region 104.

Figure 4:
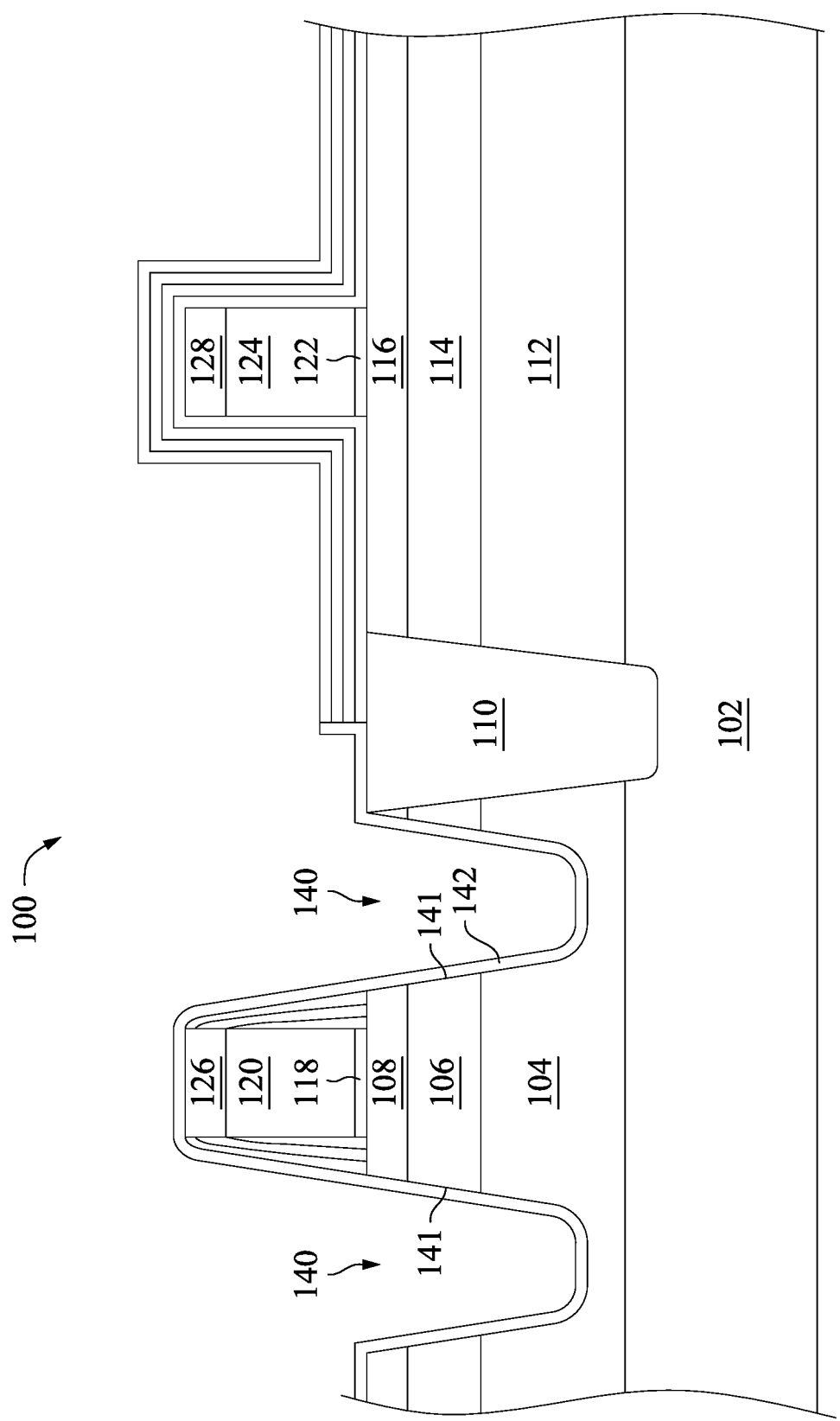

FIG. 4 is a cross-section of the integrated circuit die 100 at an intermediate stage of processing, according to one embodiment. In FIG. 4, the mask 138 has been removed and a layer of dielectric material 142 is deposited on the exposed surfaces of the integrated circuit die 100, including the exposed walls 141 of the source and drain recesses 140. As will be set forth in more detail below, the layer of dielectric material 142 will assist in improving the performance and characteristics of the N-channel transistor associated with the P-well region 104.

In one embodiment, the layer of dielectric material 142 includes silicon dioxide. The layer of dielectric material 142 is between 3 nm and 30 nm in thickness. The layer of dielectric material 142 can be deposited by chemical vapor deposition, physical vapor deposition, or atomic layer deposition. Other suitable materials, thicknesses, and deposition processes can be used for the layer of dielectric material 142 without departing from the scope of the present disclosure.

Figure 5:
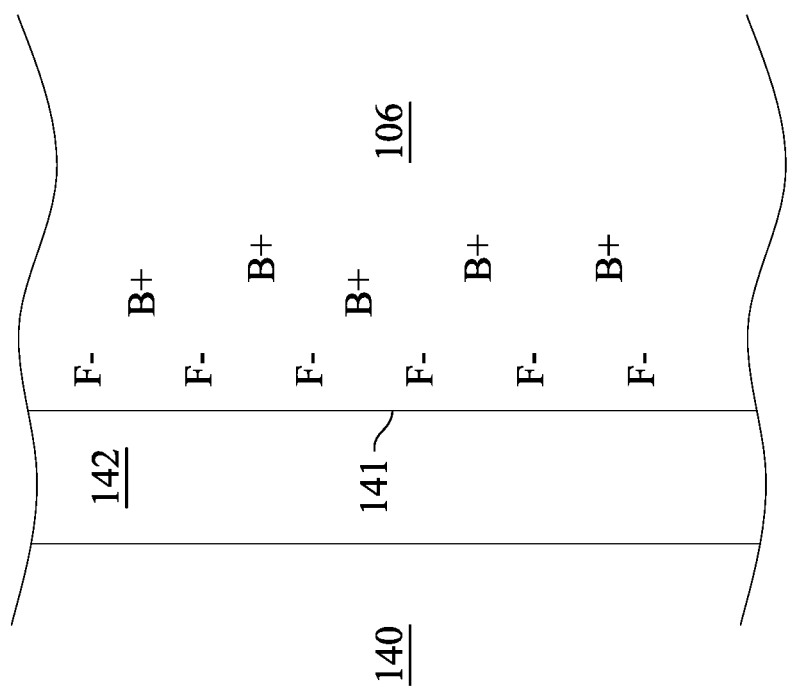

FIG. 5 is a cross section of a portion of the integrated circuit die 100 during an intermediate stage of processing, according to one embodiment. In particular, FIG. 5 is an enlarged view of a portion of the integrated circuit die 100 including source/drain recesses 140, the layer of dielectric material 142 is positioned on a sidewall 141 of the recess 140 and the anti-punch through region 106.

As was described previously in relation to FIG. 1, the anti-punch through region 106 is formed by implanting or diffusing dopant. The doping process can include implanting boron and boron fluoride into the anti-punch through region 106. After or during implantation, some of the boron and fluorine atoms separate. The result is that there are free, fluorine ions (F−) and boron ions (B+) in the anti-punch through region 106.

While the anti-punch through region 106 serves a useful function in inhibiting the DIBL effect and the accompanying short-circuits between the source and drain, the presence of the free fluorine ions can also have negative effects. For example, some of the free fluorine ions may gradually diffuse into the channel region 108. The diffusion of the fluorine ions into the channel region 108 can cause significant problems for the functionality of the N-channel transistors. As the concentration of fluorine ions in the channel region 108 increases, the conductivity of the channel region 108 decreases. If the concentration of fluorine ions in the channel region 108 is too high, then it is possible that the N-channel transistor will not conduct enough current for proper function during channel inversion. As will be described in more detail below, the deposition of the layer of dielectric material 142 can assist in reducing the concentration of fluorine atoms in the anti-punch through region 106, thereby decreasing the number of fluorine ions that can diffuse into the channel region 108.

Figure 6:
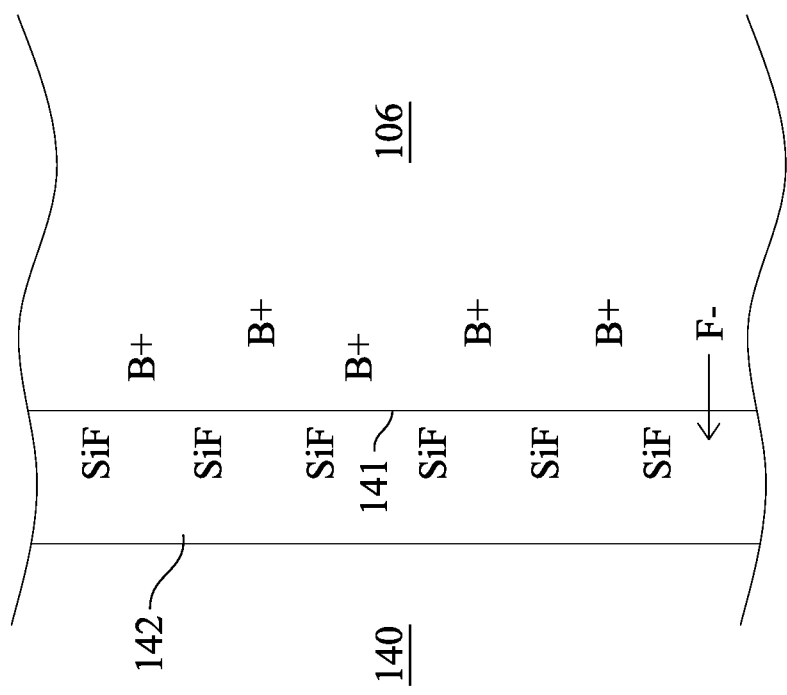

FIG. 6 is a cross-section of a portion of the integrated circuit die 100 during an intermediate stage of processing, according to one embodiment. In particular, the view of FIG. 6 is the same enlarged portion of the integrated circuit die 100 as was shown in FIG. 5. However, FIG. 6 shows the integrated circuit die 100 after an annealing process has been performed.

During the annealing process, some of the fluorine ions migrate from the anti-punch through region 106 into the layer of dielectric material 142. In the example in which the layer of dielectric material 142 includes silicon oxide, some of these fluorine ions bond with silicon atoms in the layer of dielectric material 142 to form silicon fluorine (SiF). The result is that the concentration of fluorine in the anti-punch through region 106 is reduced. Correspondingly, the concentration of fluorine in the layer of dielectric material 142 is increased.

The annealing process can include a rapid thermal annealing process. The rapid thermal annealing process can include heating the integrated circuit die 100 to a high temperature between 700° C. and 1200° C. The integrated circuit die 100 is subjected to the high temperature for a duration of time between 5 seconds and 20 seconds. The annealing process can include other temperatures and durations of time without departing from the scope of the present disclosure. For example, in some cases, the annealing process can last several minutes. The result of the annealing process is the diffusion of fluorine ions into the layer of dielectric material 142.

Figure 7:
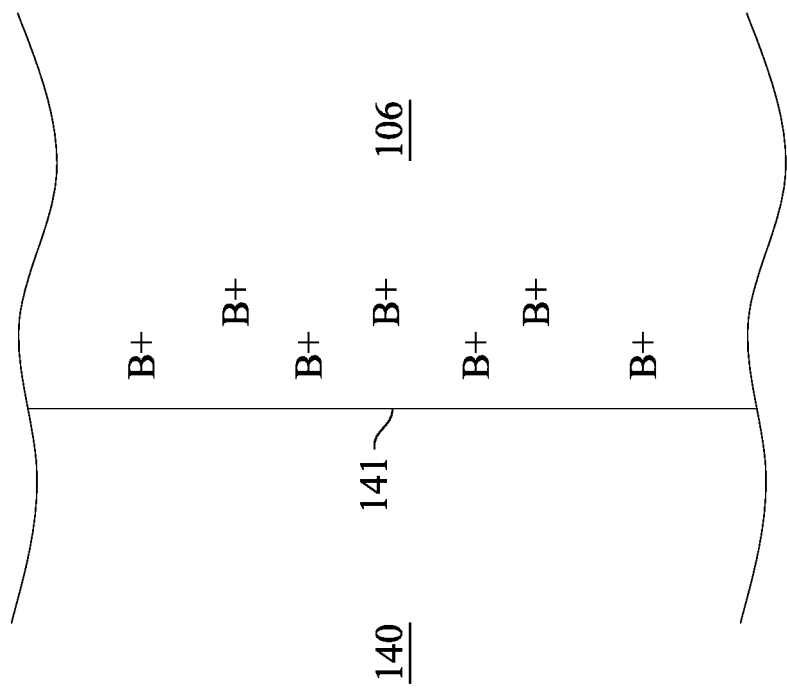

FIG. 7 is a cross-section of a portion of the integrated circuit die 100 during an intermediate stage of processing, according to one embodiment. In particular, the view of FIG. 7 is the same enlarged portion of the integrated circuit die 100 as is shown in FIG. 6. However, in FIG. 7, the layer of dielectric material 142 has been removed.

The layer of dielectric material 142 can be removed by an etching process. The etching process can include a wet etch or a dry etch. The etching process utilizes an etchant with a chemistry that selectively etches the layer of dielectric material 142 with respect to the semiconductor material of the channel region 108, the anti-punch through region 106, and the P-well region 104. The etching process can include an isotropic etching process that etches the layer of dielectric material 142 at a substantially similar rate for all directions. The etching process can include a timed etch. The duration of the etch is selected to be sufficient to remove the entire layer of dielectric material 142. The duration of the etch is selected to be sufficiently short so that the semiconductor material of the channel region 108, the anti-punch through region 106, and the P-well region 104 are not etched to a significant degree. For example, the etching process may remove between 2 Å and 10 Å of semiconductor material. Accordingly, the width of the recesses 140 is not substantially increased after the etching process that removes the layer of dielectric material 142.

When the layer of dielectric material 142 is removed, all the fluorine atoms that migrated into the layer of dielectric material 142 are also removed. Accordingly, a large number of fluorine atoms is removed with the removal of the layer of dielectric material 142. In one example, the concentration of fluorine atoms in the anti-punch through region 106 prior to deposition of the layer of dielectric material 142 is between $1E4/cm^3$ and $1E5/cm^3$. The concentration of fluorine atoms in the anti-punch through region 106 after removal of the layer of dielectric material 142 is between $1E2/cm^3$ and $1E3/cm^3$. Accordingly, in one embodiment, the concentration of fluorine atoms in the anti-punch through region 106 after the removal of the layer of dielectric material 142 is less than $1E4/cm^3$. In one embodiment, the concentration of fluorine atoms in the anti-punch through region 106 after removal of the layer of dielectric material 142 is less than $1E3/cm^3$. On the other hand, the deposition of the layer of dielectric material 142, the annealing process, and the removal of the layer of dielectric material 142 does not adversely impact the concentration of desirable boron atoms in the anti-punch through region 106. Thus, the deposition of the layer of dielectric material 142, the annealing process, and the removal of the layer of dielectric material 142 removes unwanted dopants without adversely impacting the concentration of desired dopants.

The description of FIGS. 5-7 has primarily discussed an embodiment in which the anti-punch through region 106 includes boron and fluorine atoms. However, the anti-punch through region 106 can include other types of dopants, including other types of desirable dopants and undesirable dopants without departing from the scope of the present disclosure. The deposition of the layer of dielectric material 142, the annealing process, and the removal of the layer of dielectric material 142 can remove other types of undesirable dopants other than those specifically described ever.

Figure 8:
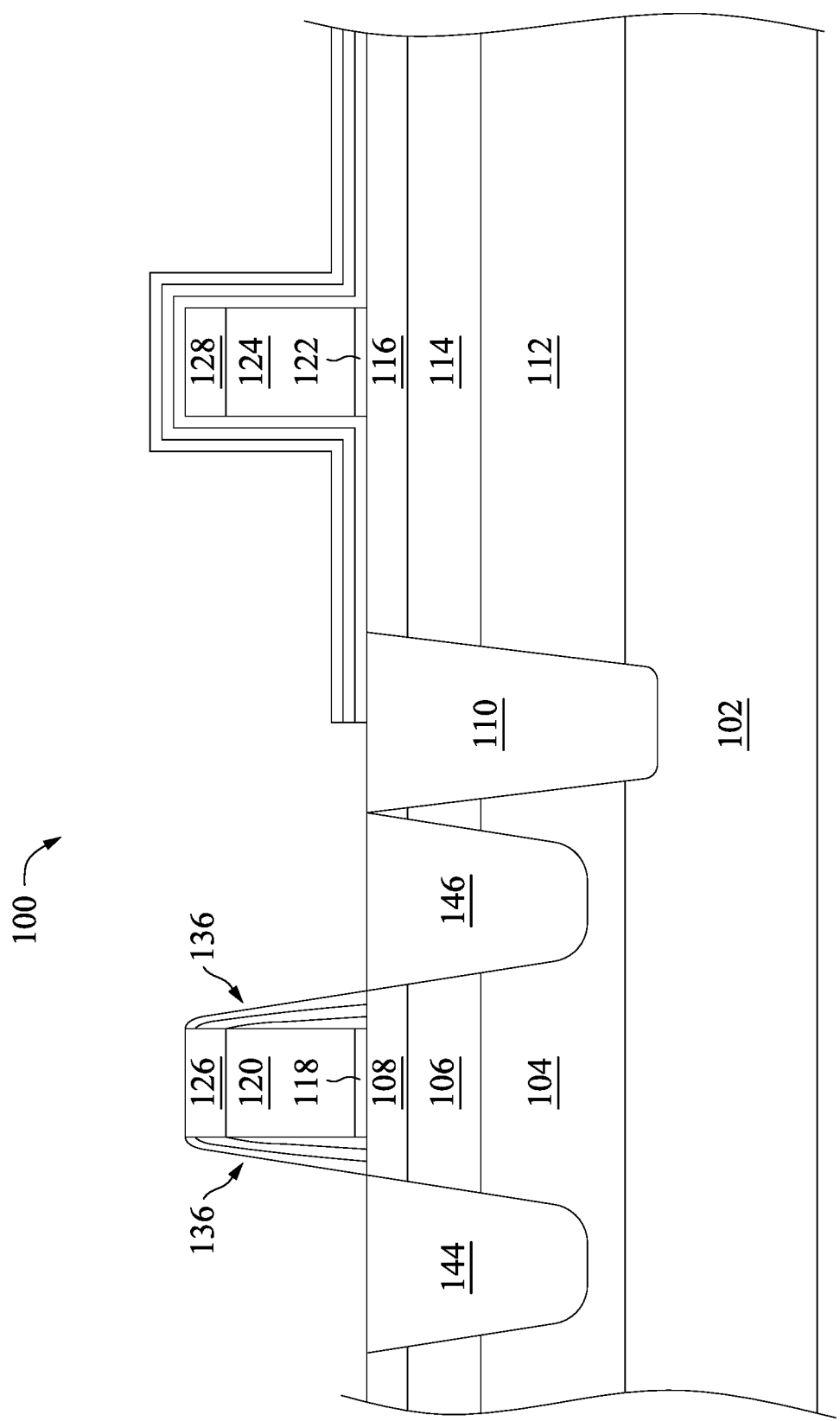

FIG. 8 is a cross section of a portion of the integrated circuit die 100 during an intermediate stage of processing, according to one embodiment. In FIG. 8, a source region 144 and a drain region 146 have been formed in the recesses 140.

The source and drain regions 144, 146 include a semiconductor material. The semiconductor material of the source and drain regions 144, 146 is heavily doped with an N-type dopant. In one example, the semiconductor material includes monocrystalline silicon and the dopant includes phosphorus. Other semiconductor materials and dopants can be used for the source and drain regions 144, 146 without departing from the scope of the present disclosure.

The source and drain regions 144, 146 can be formed by an epitaxial growth. Accordingly, the monocrystalline semiconductor material is epitaxially grown from the P-well region 104, the anti-punch through region 106, and the channel region 108. The N-type dopants can be implanted in situ during the epitaxial growth. Other processes for forming the source and drain regions 144, 146 and for implanting N-type dopants in the source and drain regions 144, 146 can be utilized without departing from the scope of the present disclosure. Those of skill in the art will recognize, in light of the present disclosure, that many alternative or additional processes can be utilized to form the various features of an N-channel FinFET transistor without departing from the scope of the present disclosure.

Another benefit of the annealing and removal of the layer of dielectric material 142 is that the sidewalls 141 of the recess 140 are significantly smoother after removal of the layer of dielectric material 142. This provides an additional benefit that boron atoms, or other P-type dopants are not lost at the surface of the recesses 140. When the source and drain regions 144, 146 are formed in the recesses 140, the interface between the anti-punch through region 106 and the source and drain regions 144, 146 will, thus, include an improved P-N interface that reduces leakage current between the anti-punch through region 106 and the source and drain regions 144, 146. In one example, the maximum peak to valley roughness between the interfaces of the source/drain regions 144, 146 and the anti-punch through region 106 is between 0.2 nm 1 nm. Accordingly, the maximum peak to valley roughness can be less than 1 nm, or less than 0.4 nm. The smoother interface results in smaller leakage currents between the source and drain regions 144, 146 and the P-well region 104 via the anti-punch through region 106.

Figure 9:
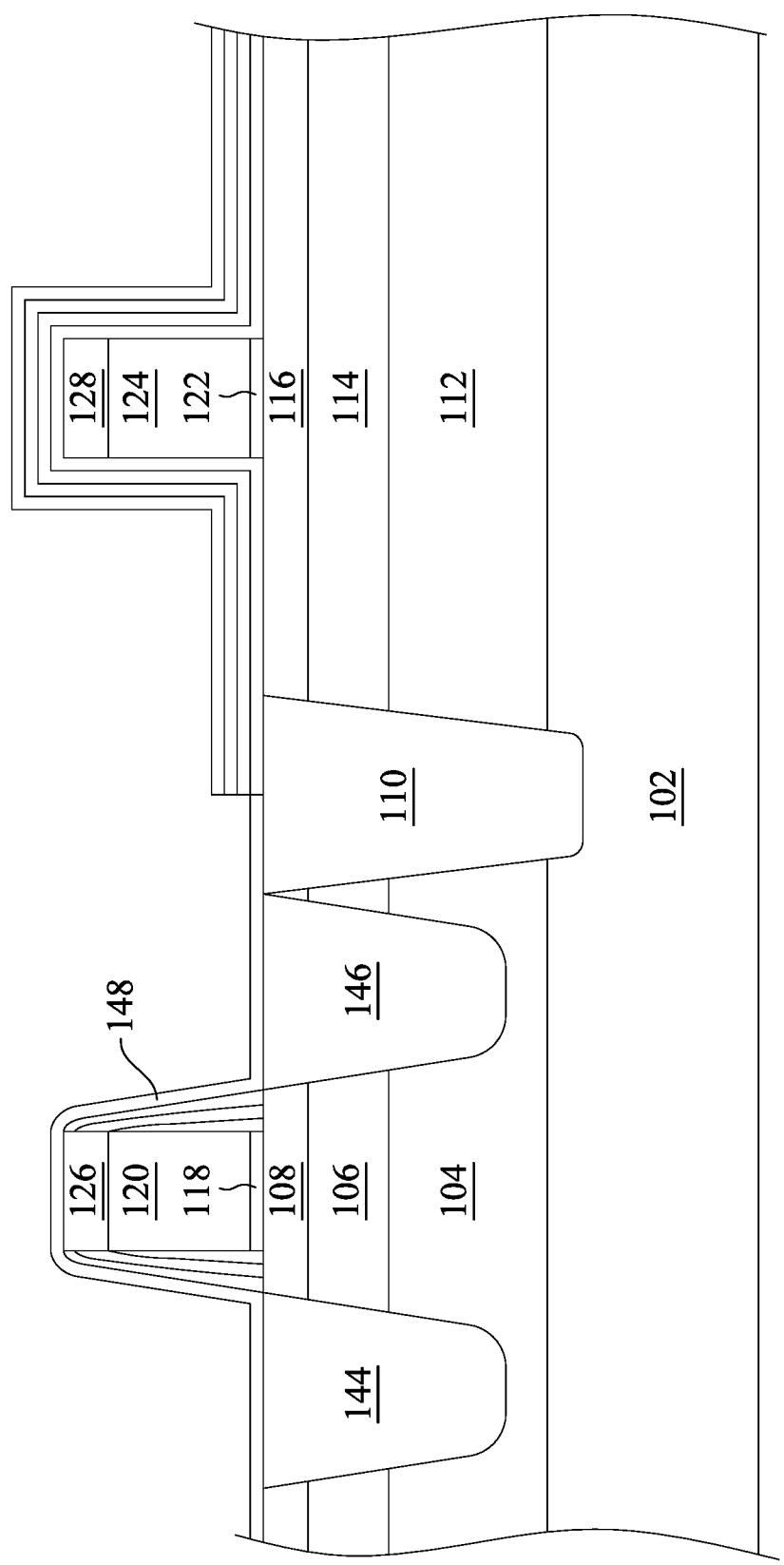

FIG. 9 is a cross section of a portion of the integrated circuit die 100 during an intermediate stage of processing, according to one embodiment. In FIG. 9, a layer of dielectric material 148 has been deposited on the integrated circuit die 100. The layer of dielectric material 148 can include silicon nitride. Other dielectric materials can be used for the layer of dielectric material 148 without departing from the scope of the present disclosure.

FIG. 9 is a cross-section of a portion of the integrated circuit die 100 during an intermediate stage of processing, according to one embodiment. In FIG. 9, a dielectric layer 150 is deposited in the recesses 144 in the dielectric layer 106 and on the second sidewall spacer 148. The dielectric layer 152 is deposited on the dielectric layer 150.

Figure 10:
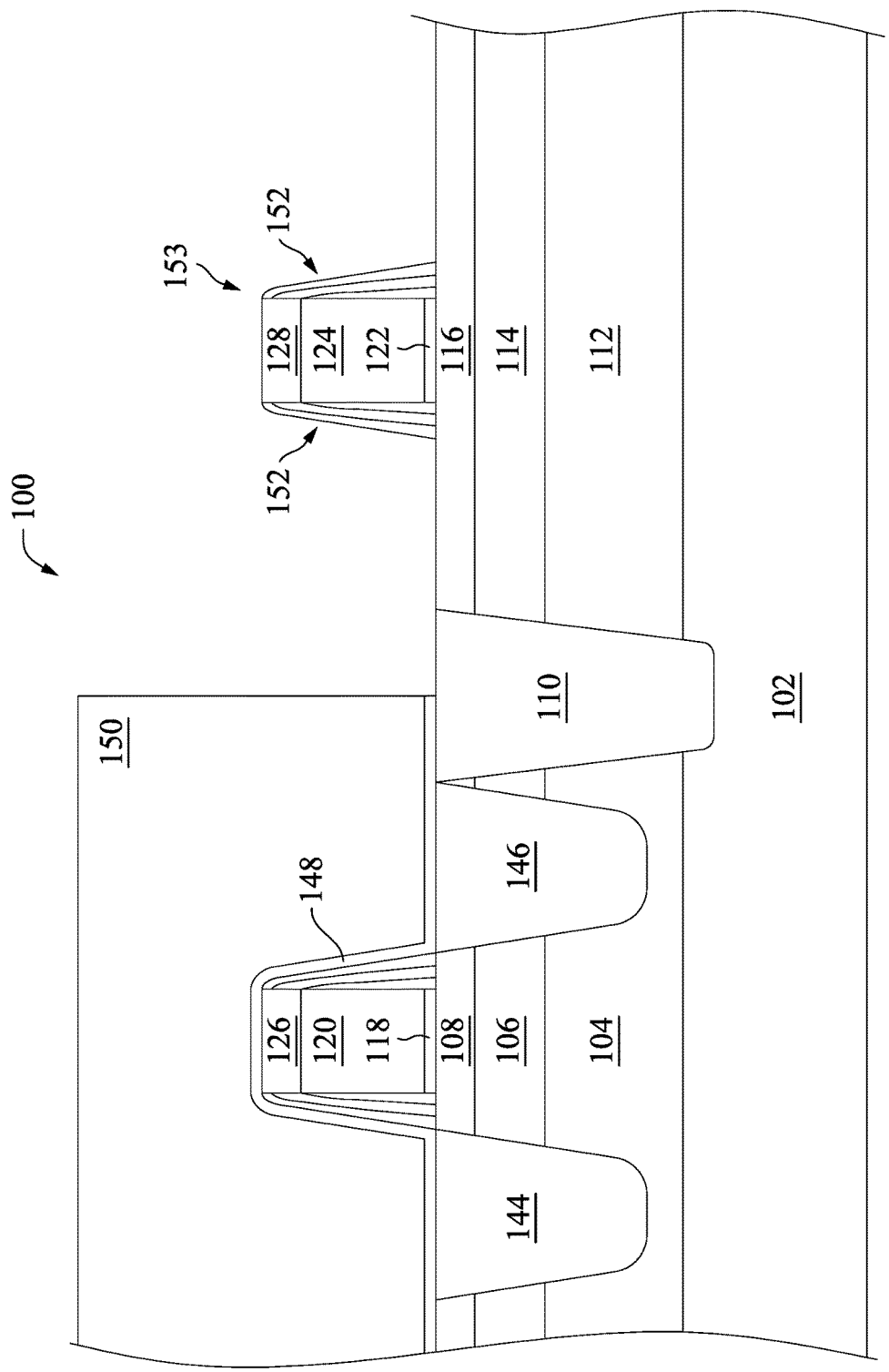

FIG. 10 is a cross-section of the integrated circuit die 100 at an intermediate stage of processing, according to one embodiment. In FIG. 10, a mask 150 is formed on top of the layer of dielectric material 148 over the portion of the integrated circuit die 100 corresponding to the P-channel FinFET transistor. The mask 150 can be formed using common photolithography techniques including depositing a layer of photoresist, exposing the photoresist to light in the presence of a photolithography mask, and removing non-hardened portions of the photoresist. Other suitable processes and materials can be used to form the mask 150 without departing from the scope of the present disclosure.

A sidewall spacer 152 is formed on sidewalls of the gate electrode 124. The sidewall spacer 152 is formed by etching the exposed portions of the spacer layers 130, 132, and 134 and the layer of dielectric material 148. The etching process completely removes the spacer layers 130, 132, and 134 and the layer of dielectric material 148 at those exposed locations where the spacer layers 130, 32, 134 and the layer of dielectric material were thinnest in the vertical direction.

The sidewall spacer 152 is formed by using an anisotropic etching process. The anisotropic etching process selectively etches in the downward direction. The result is that the spacer layers are not significantly etched from the sidewalls of the gate electrode because the spacer layers 130, 132, and 134 are vertically thick along the sidewalls of the gate electrode 124. Accordingly, after the etching process, the sidewall spacers 152 remain as shown in FIG. 10.

A gate stack 153 includes the gate dielectric 122, the gate electrode 124, the hard mask 128, and the sidewall spacer 152. The gate stack 153 wraps around a semiconductor fin, as shown in more detail in relation to FIG. 18.

Figure 11:
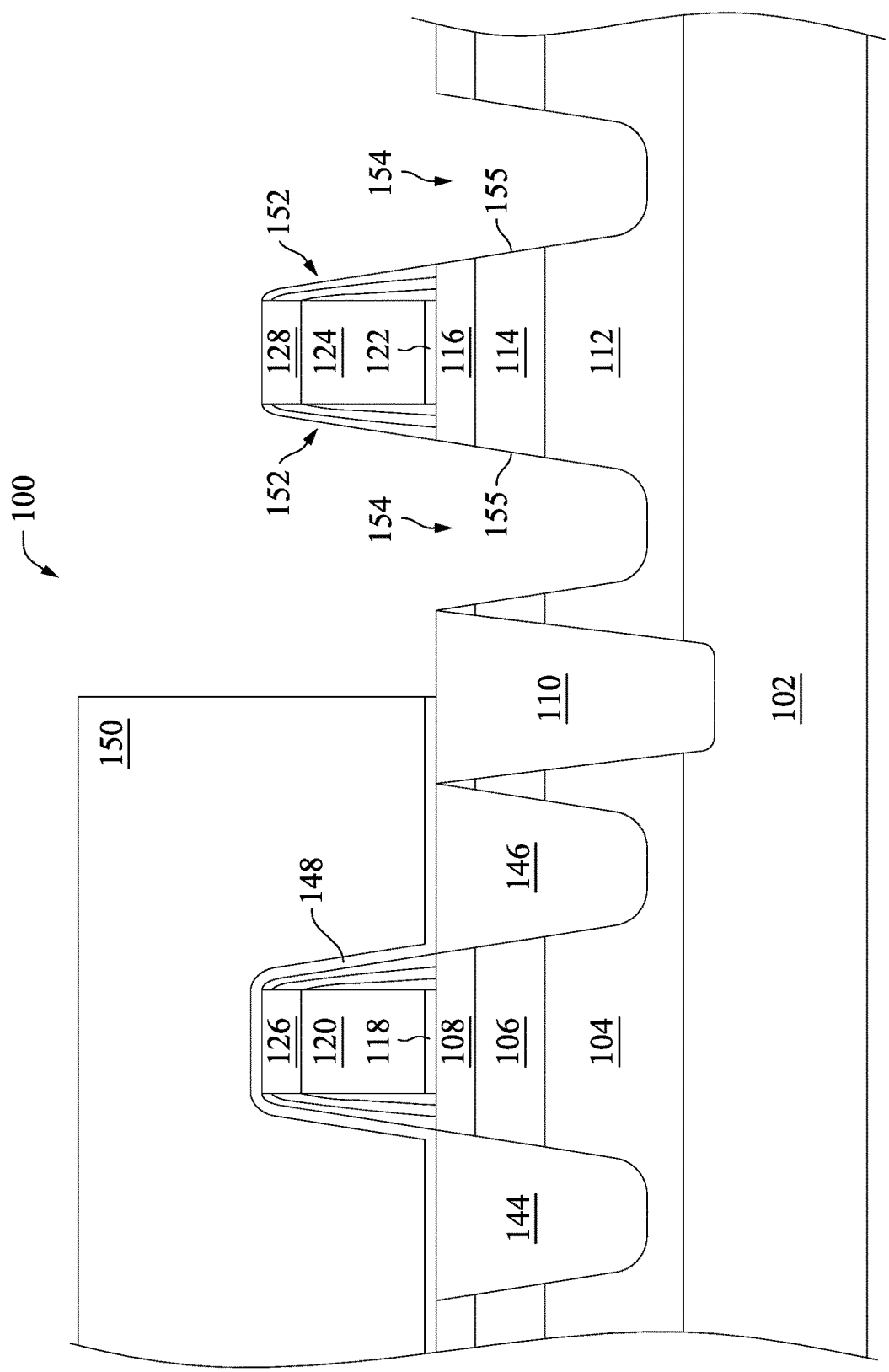

FIG. 11 is a cross-section of the integrated circuit die 100 at an intermediate stage of processing, according to one embodiment. In FIG. 11, source and drain recesses 154 are formed in the semiconductor material in the N-well region 112, the anti-punch through region 114, and the channel region 116. As will be described in more detail below, the source and drain recesses 154 will be utilized to form source of drain regions for a P-channel FinFET transistor.

The etching process for forming the source and drain recesses 154 selectively etches the semiconductor material associated with the various semiconductor regions 112, 114, 116 with respect to the trench isolation region 110, sidewall spacer 152, the hard mask 128, and the mask 150. In other words, the etching process etches the semiconductor material associated with the channel region 116, the anti-punch through region 114, and the N-well region 112 at a significantly higher rate than the materials of the sidewall spacer 152, the hard mask 128, and the mask 150. The etching process can include a wet etch or dry etch. Accordingly, the chemistry of the etchant selectively etches the semiconductor material of the various semiconductor regions 112, 114, 116.

The etching process for forming the source and drain recesses 154 is an isotropic etch. The isotropic etch etches in all directions substantially at the same rate. Accordingly, the bottom of the recesses 154 will have a semicircular shape. Alternatively, the etching process for forming the source and drain recesses 154 can include an anisotropic etch that selectively etches in the downward direction a significantly higher rate than in other directions. In this case, the recesses 154 would have substantially vertical walls and a substantially flat bottom. The etching process for forming the source and drain recesses can include one or more of a wet etch, a dry etch, or ion beam etching. Those of skill in the art will recognize, in light of will recognize, in light of present disclosure, that other etching processes can be utilized without departing from the scope of the present disclosure.

Figure 12:
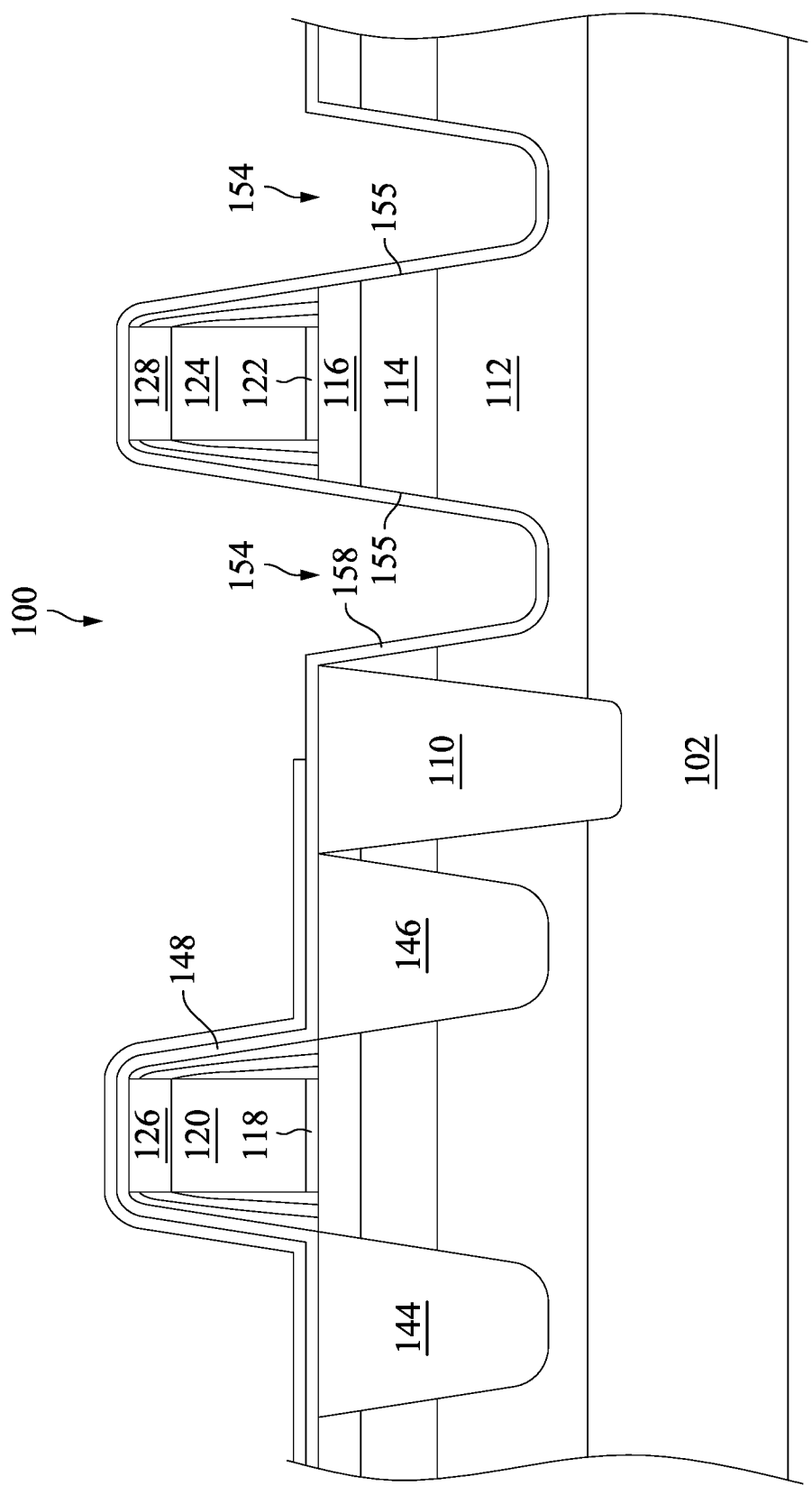

FIG. 12 is a cross-section of the integrated circuit die 100 at an intermediate stage of processing, according to one embodiment. In FIG. 12, the mask 150 has been removed and a layer of dielectric material 158 is deposited on the exposed surfaces of the integrated circuit die 100, including the exposed sidewalls 155 of the source and drain recesses 154. As will be set forth in more detail below, the layer of dielectric material 158 will assist in improving the performance and characteristics of the P-channel transistor associated with the N-well region 112.

In one embodiment, the layer of dielectric material 158 includes silicon dioxide. The layer of dielectric material 158 is between 3 nm and 30 nm in thickness. The layer of dielectric material 158 can be deposited by chemical vapor deposition, physical vapor deposition, or atomic layer deposition. Other suitable materials, thicknesses, and deposition processes can be used for the layer of dielectric material 158 without departing from the scope of the present disclosure.

Figure 13:
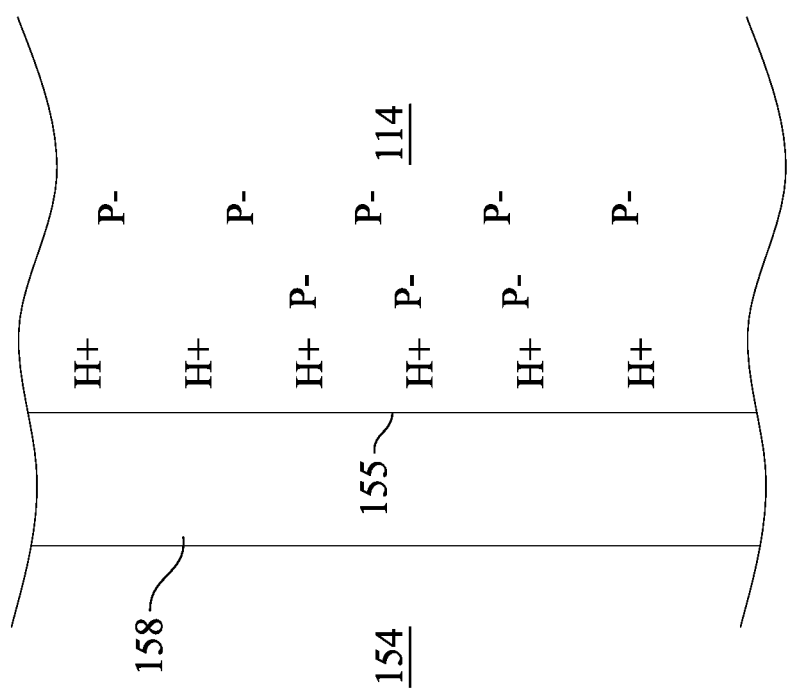

FIG. 13 is a cross section of a portion of the integrated circuit die 100 during an intermediate stage of processing, according to one embodiment. In particular, FIG. 13 is an enlarged view of a portion of the integrated circuit die 100 including source/drain recesses 154, the layer of dielectric material 158 on a sidewall 155 of the recess 154, and the anti-punch through region 114.

As was described previously in relation to FIG. 1, the anti-punch through region 114 is formed by implanting or diffusing dopant. The doping process can include implanting phosphorus and phosphorus hydrogen into the anti-punch through region 114. After or during implantation, some of the phosphorus and hydrogen atoms separate. The result is that there are free, hydrogen ions (H+) and free phosphorus ions (P−) in the anti-punch through region 114.

While the anti-punch through region 114 serves a useful function in inhibiting the DIBL effect and accompanying short-circuits between the source and drain, the presence of the free hydrogen ions can also have negative effects. For example, some of the free hydrogen ions may gradually diffuse into the channel region 116. The diffusion of the hydrogen ions into the channel region 116 can cause significant problems for the functionality of the P-channel transistor. As the concentration of hydrogen ions in the channel region 116 increases, the conductivity of the channel region 116 decreases. If the concentration of hydrogen ions in the channel region 116 is too high, then it is possible that the P-channel transistor will not conduct enough current for proper function during channel inversion. As will be described in more detail below, the deposition of the layer of dielectric material 158 can assist in reducing the concentration of hydrogen atoms in the anti-punch through region 114, thereby decreasing the number of hydrogen ions that can diffuse into the channel region 116.

Figure 14:
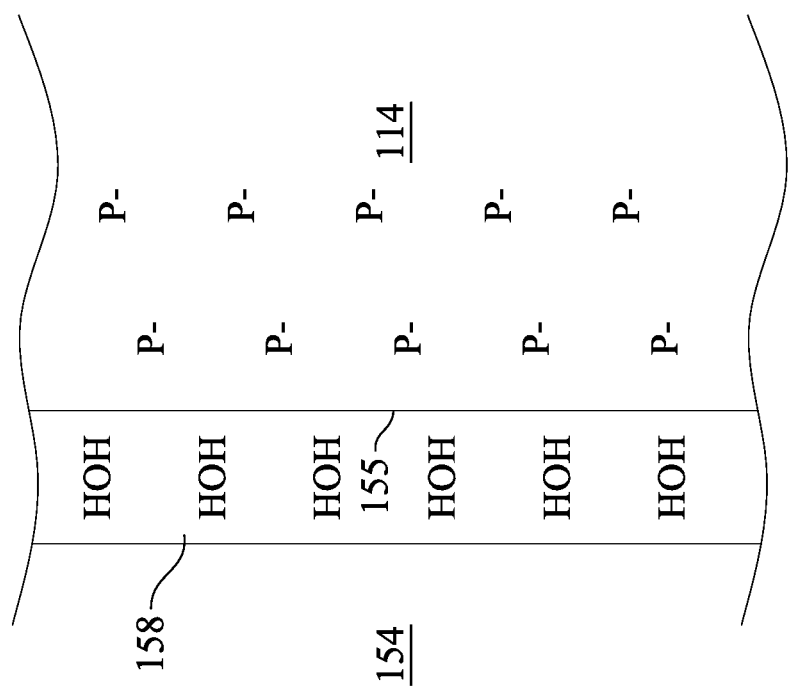

FIG. 14 is a cross-section of a portion of the integrated circuit die 100 during an intermediate stage of processing, according to one embodiment. In particular, the view of FIG. 14 is the same enlarged portion of the integrated circuit die 100 as was shown in FIG. 13. However, FIG. 14 shows the integrated circuit die 100 after an annealing process has been performed.

During the annealing process, some of the hydrogen ions migrate from the anti-punch through region 114 into the layer of dielectric material 158. In the example in which the layer of dielectric material 158 includes silicon oxide, some of these hydrogen ions bond with silicon atoms in the layer of dielectric material 158 to form hydrogen oxide (HOH). The result is that the concentration of hydrogen in the anti-punch through region 114 is reduced. Correspondingly, the concentration of hydrogen in the layer of dielectric material 158 is increased.

The annealing process can include a rapid thermal annealing process. The rapid thermal annealing process can include heating the integrated circuit die 100 to a high temperature between 700° C. and 1200° C. The integrated circuit die 100 is subjected to the high temperature for a duration of time between 5 seconds and 20 seconds. The annealing process can include other temperatures and durations of time without departing from the scope of the present disclosure. For example, in some cases, the annealing process can last up to several minutes. The result of the annealing process is the diffusion of hydrogen ions into the layer of dielectric material 158.

Figure 15:
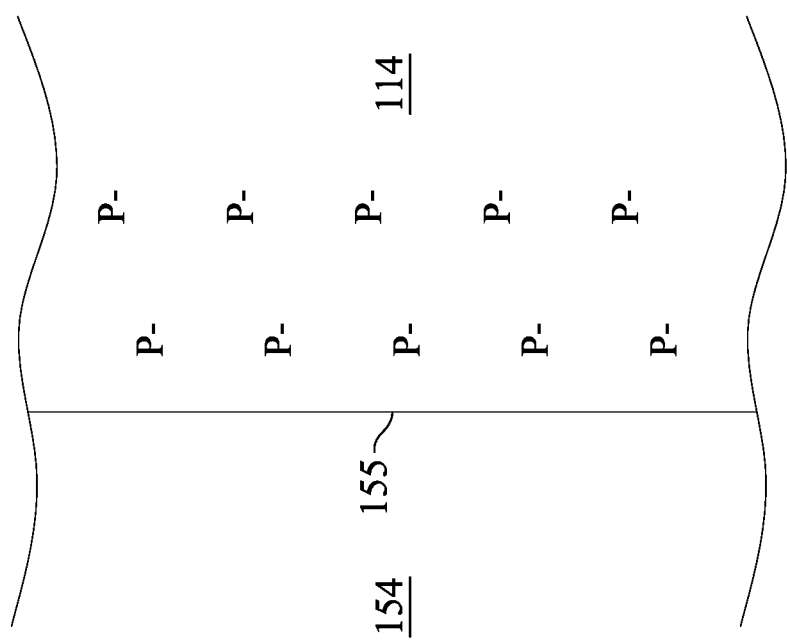

FIG. 15 is a cross-section of a portion of the integrated circuit die 100 during an intermediate stage of processing, according to one embodiment. In particular, the view of FIG. 15 is the same enlarged portion of the integrated circuit die 100 as is shown in FIG. 14. However, in FIG. 15, the layer of dielectric material 158 has been removed.

The layer of dielectric material 158 can be removed by an etching process. The etching process can include a wet etch or a dry etch. The etching process utilizes an etchant with a chemistry that selectively etches the layer of dielectric material 158 with respect to the semiconductor material of the channel region 116, the anti-punch through region 114, and the N-well region 112. The etching process can include an isotropic etching process that etches the layer of dielectric material 158 at a substantially similar rate for all directions. The etching process can include a timed etch. The duration of the etch is selected to be sufficient to remove the entire layer of dielectric material 158. The duration of the etch is selected to be sufficiently short so that the semiconductor material of the channel region 116, the anti-punch through region 114, and the N-well region 112 are not etched to a significant degree. For example, the etching process may remove between 2 Å and 10 Å of semiconductor material. Accordingly, the width of the recesses 154 is not substantially increased after the etching process that removes the layer of dielectric material 158.

When the layer of dielectric material 158 is removed, all the hydrogen atoms that migrated into the layer of dielectric material 158 are also removed. Accordingly, a large number of hydrogen atoms is removed with the removal of the layer of dielectric material 158. In one example, the concentration of hydrogen atoms in the anti-punch through region 114 prior to deposition of the layer of dielectric material 158 is between $1E4/cm^3$ and $1E5/cm^3$. The concentration of hydrogen atoms in the anti-punch through region 114 after removal of the layer of dielectric material 158 is between $1E2/cm^3$ and $1E3/cm^3$. Accordingly, in one embodiment, the concentration of hydrogen atoms in the anti-punch through region 114 after the removal of the layer of dielectric material 158 is less than $1E4/cm^3$. In one embodiment, the concentration of hydrogen atoms in the anti-punch through region 114 after removal of the layer of dielectric material 158 is less than $1E3/cm^3$. On the other hand, the deposition of the layer of dielectric material 158, the annealing process, and the removal of the layer of dielectric material 158 does not adversely impact the concentration of desirable phosphorus atoms in the anti-punch through region 114. Thus, the deposition of the layer of dielectric material 158, the annealing process, and the removal of the layer of dielectric material 158 removes unwanted dopant atoms without adversely impacting the concentration of desired dopant atoms.

The description of FIGS. 13-15 has primarily discussed an embodiment in which the anti-punch through region includes phosphorus and hydrogen atoms. However, the anti-punch through region 114 can include other types of dopants, including other types of desirable dopants and undesirable dopants without departing from the scope of the present disclosure. For example, undesirable carbon atoms can be diffused into the layer of dielectric material 158 and removed. The deposition of the layer of dielectric material 158, the annealing process, and the removal of the layer of dielectric material 158 can remove other types of undesirable dopants other than those specifically described above.

Figure 16:
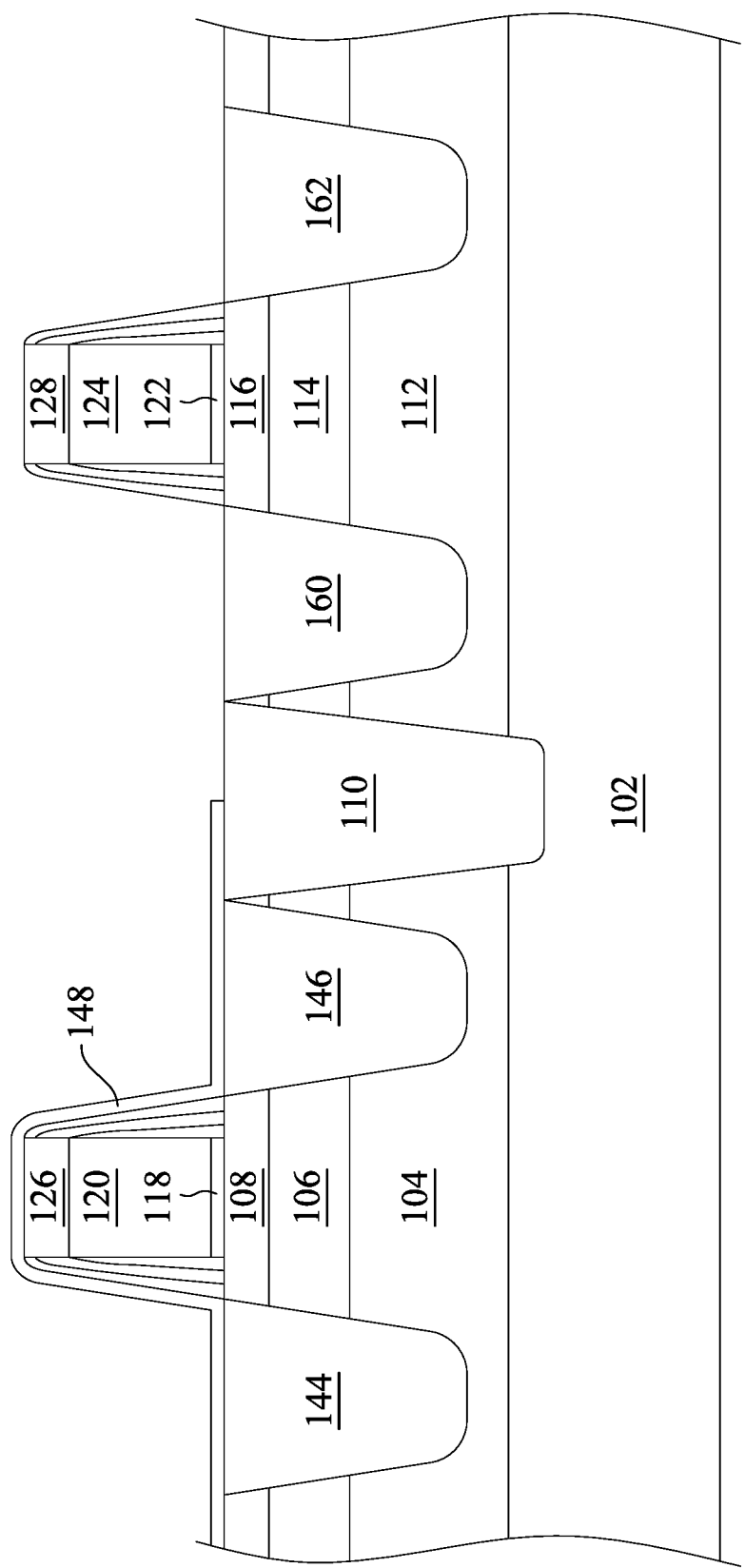

FIG. 16 is a cross section of a portion of the integrated circuit die 100 during an intermediate stage of processing, according to one embodiment. In FIG. 16, a source region 160 and a drain region 162 have been formed in the recesses 154.

The source and drain regions 160, 162 include a semiconductor material. The semiconductor material of the source and drain regions 160, 162 is heavily doped with a P-type dopant. In one example, the semiconductor material includes monocrystalline silicon and the dopant includes boron. In another example, the semiconductor material includes silicon germanium (SiGe) and the dopant includes boron. Other semiconductor materials and dopants can be used for the source and drain regions 160, 162 without departing from the scope of the present disclosure.

The source and drain regions 160, 162 can be formed by an epitaxial growth. Accordingly, the monocrystalline semiconductor material is epitaxially grown from the N-well region 112, the anti-punch through region 114, and the channel region 116. The P-type dopants can be implanted in situ during the epitaxial growth. Other processes for forming the source and drain regions 160, 162 and for implanting P-type dopants in the source and drain regions 160, 162 can be utilized without departing from the scope of the present disclosure. Those of skill in the art will recognize, in light of the present disclosure, that many alternative or additional processes can be utilized to form the various features of a P-channel FinFET transistor without departing from the scope of the present disclosure.

Another benefit of the annealing and removal of the layer of dielectric material 158 is that the sidewalls of the recess 154 are significantly smoother after removal of the layer of dielectric material 158. This provides an additional benefit that phosphorus atoms, or other N-type dopants are not lost at the surface of the recesses 154. When the source and drain regions 160, 162 are formed in the recesses 154, the interface between the anti-punch through region 114 and the source and drain regions 160, 162 will, thus, include an improved P-N interface that reduces leakage current between the anti-punch through region 114 and the source and drain regions 160, 162. In one example, the maximum peak to valley roughness between the interfaces of the source/drain regions 160, 162 and the anti-punch through region 114 is between 0.2 nm 1 nm. Accordingly, the maximum peak to valley roughness can be less than 1 nm, or less than 0.4 nm. The smoother interface results in smaller leakage currents between the source and drain regions 160, 162 and the N-well region 112 via the anti-punch through region 114.

Figure 17:
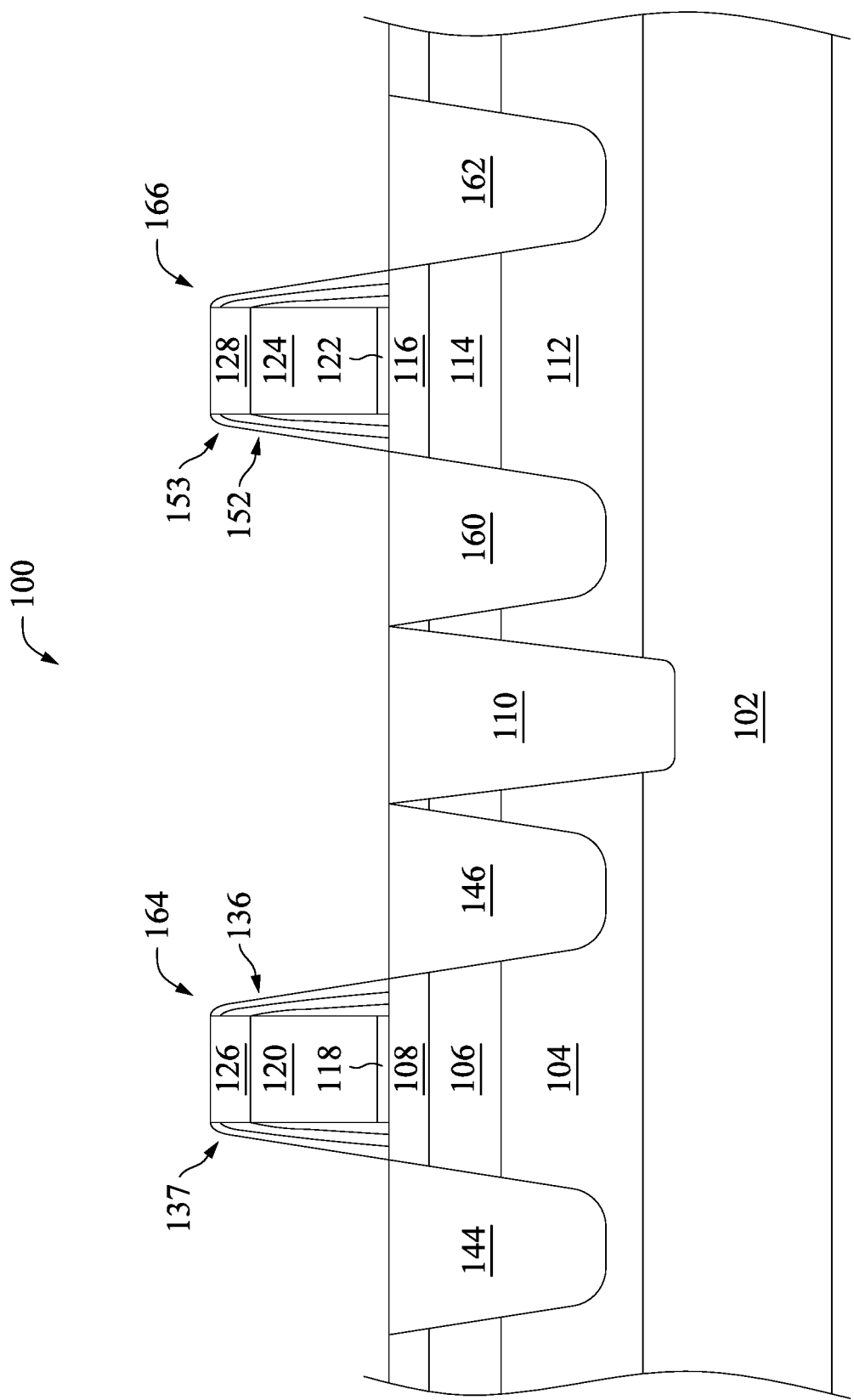

FIG. 17 is a cross section of a portion of the integrated circuit die 100 during an intermediate stage of processing, according to one embodiment. In FIG. 17 the layer of dielectric material 148 has been removed. FIG. 17 shows the N-channel FinFET transistor 164 and the P-channel FinFET transistor 166. In practice, the integrated circuit die 100 can include a large number of N-channel FinFET transistors 164 and P-channel FinFET transistors 166. FIG. 17 does not illustrate source and drain contacts or other common integrated circuit structures. Those of skill in the art will recognize, in light of the present disclosure that the integrated circuit die 100 will include many other structures and features without departing from the scope of the present disclosure.

Figure 18:
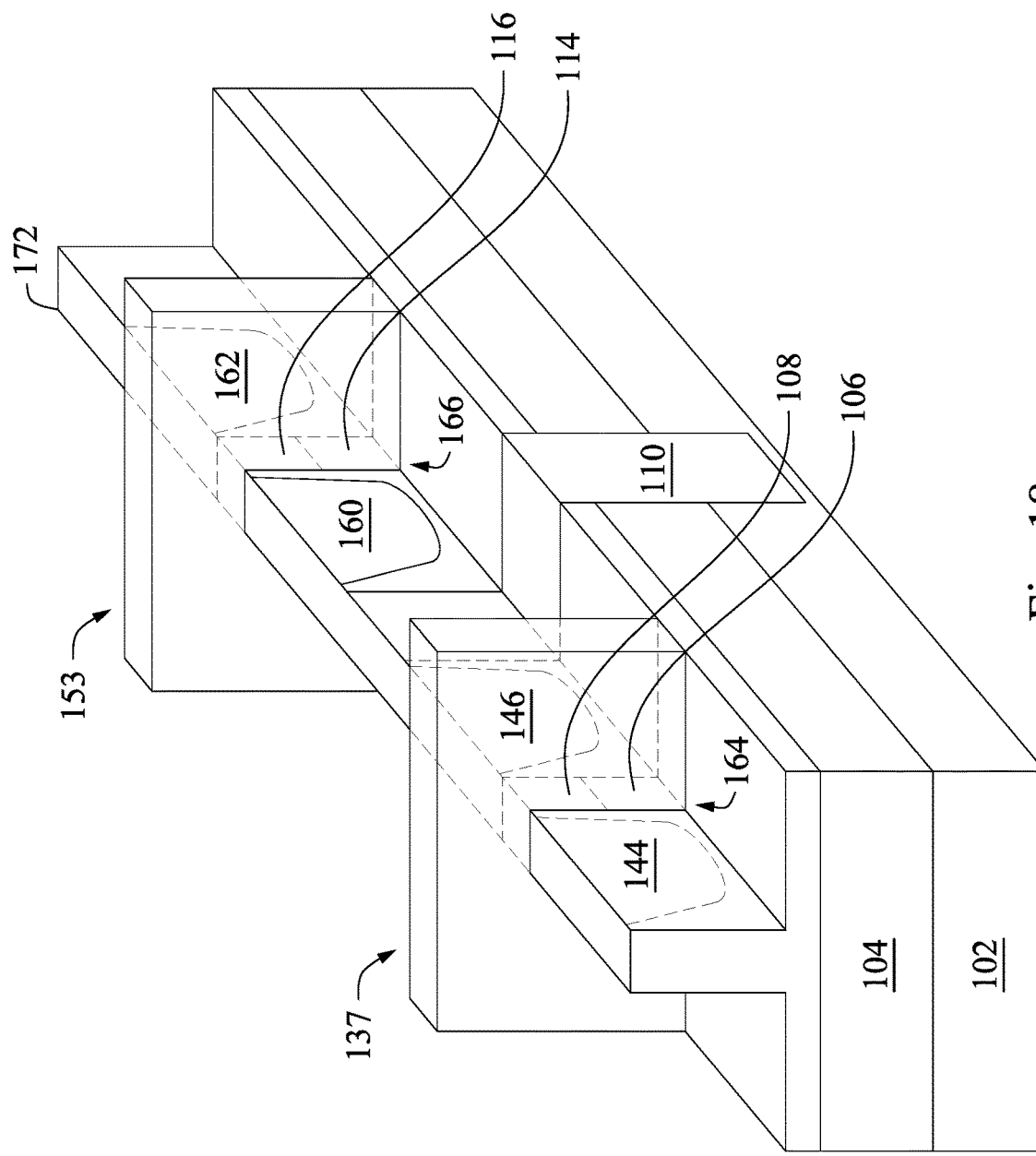
FIG. 18 is a perspective view of an integrated circuit die, according to one embodiment.

FIG. 18 is a perspective view of a portion of the integrated circuit die of FIG. 17, according to one embodiment. The perspective view of FIG. 17 illustrates a semiconductor fin 172 protruding from the semiconductor substrate 102. The source and drain regions 144, 146, the channel region 108, and a portion of the anti-punch through region 106 are positioned in the semiconductor fin 172. The gate stack 137 is wrapped around the semiconductor fin 172. Accordingly, the gate electrode 120 and the gate dielectric 118 are wrapped around the channel region 108, enabling the gate electrode to more effectively render the channel region 108 conducting or nonconducting when selected voltages are applied to the gate electrode 120. Though not shown in FIG. 18, one or more dielectric layers may be positioned on either side of the semiconductor fin 172. The one or more dielectric layers may be present during formation of the source and drain regions 144, 146, 160, 162.

The source and drain regions 160, 162, the channel region 116, and a portion of the anti-punch through region 114 are positioned in the semiconductor fin 172. The gate stack 153 is wrapped around the semiconductor fin 172. Accordingly, the gate electrode 124 and the gate oxide 122 are wrapped around the channel region 116, enabling the gate electrode to more effectively render the channel region 116 conducting or nonconducting when selected voltages are applied to the gate electrode 124.

In FIG. 18 the anti-punch through regions 106, 114 extend below the semiconductor fin 144 and the corresponding source and drain regions 144, 146, 160, 162. However, in some embodiments, the anti-punch through regions may not extend below the semiconductor fin 172. In these cases, the N-well and P-well regions 104, 112 may extend into the semiconductor fin 172. Those of skill in the art will recognize, in light of the present disclosure, that the integrated circuit die 100 may have various configurations and elements not differing from those shown in the Figures without departing from the scope of the present disclosure.

As described herein, the semiconductor fin 172 may include a single type of semiconductor material including various doped regions. Alternatively, the semiconductor fin may include multiple semiconductor materials and various doped regions.

Figure 19:
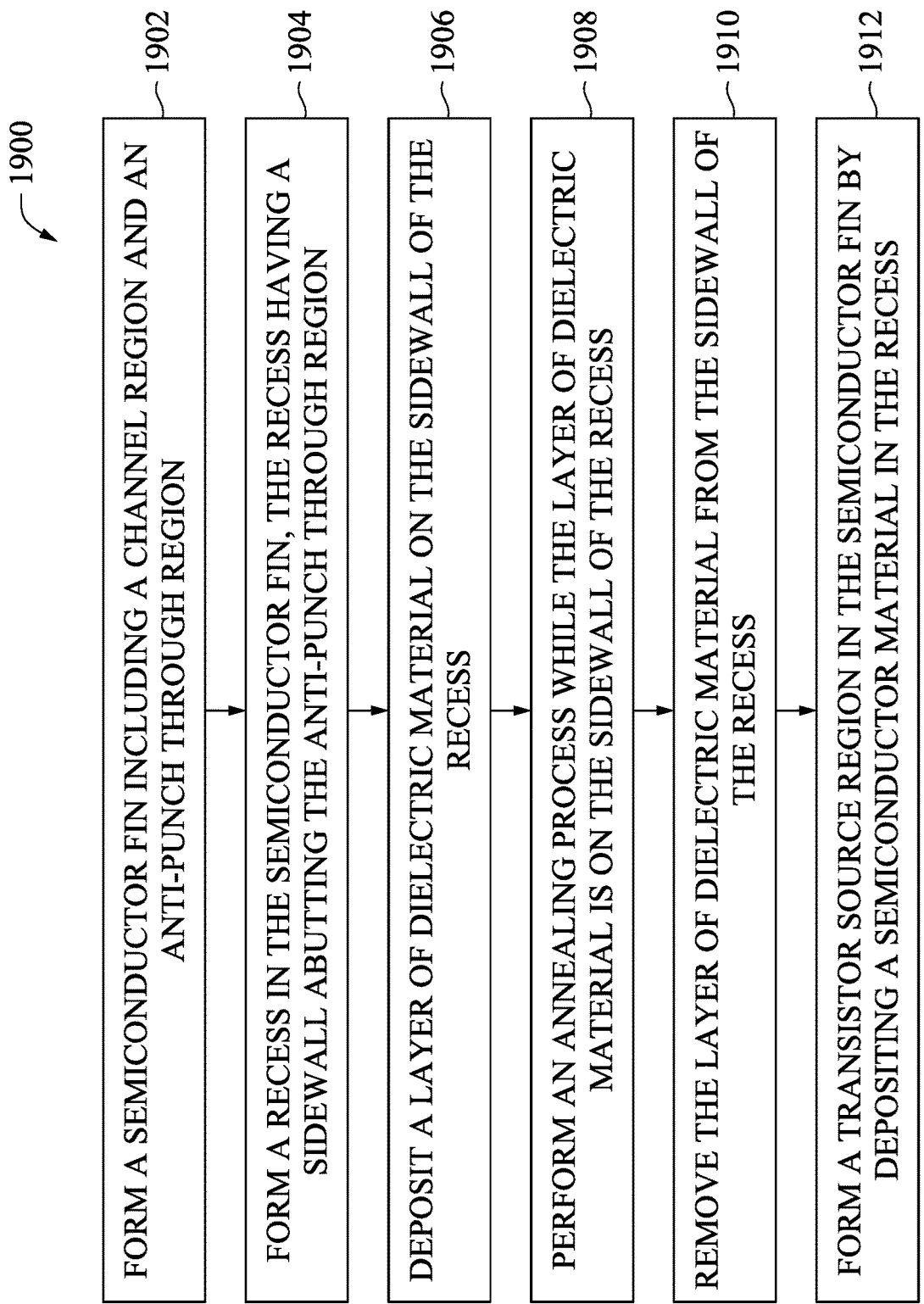
FIG. 19 is a method for fabricating an integrated circuit die, according to an embodiment.

FIG. 19 is a method 1900 for fabricating an integrated circuit die, according to an embodiment. At 1902, the method 1900 includes forming a semiconductor fin including a channel region and an anti-punch through region. One example of a semiconductor fin is the semiconductor fin 172 of FIG. 18. One example of a channel region is the channel region 108 of FIG. 1. One example of an anti-punch through region is the anti-punch through region 106 of FIG. 1. At 1904, the method 1900 includes forming a recess in the fin, the recess having a sidewall abutting the anti-punch through region. One example of a recess is the recess 140 of FIG. 3. At 1906, the method 1900 includes depositing a layer of dielectric material on the sidewall of the recess. One example of a layer of dielectric material is the layer of dielectric material 142 of FIG. 4. At 1908, the method 1900 includes performing an annealing process while the layer of dielectric material is on the sidewall of the recess. At 1910, the method 1900 includes removing the layer of dielectric material from the sidewall of the recess. At 1912, the method 1900 includes forming a transistor source region in the semiconductor fin by depositing a semiconductor material in the recess. One example of a transistor source region is the source region 144 of FIG. 8. The method 1900 can be suitable for forming an integrated circuit die 100 other than shown in the aforementioned Figures without departing from the scope of the present disclosure.

In one embodiment, a method includes forming a semiconductor fin including a channel region and an anti-punch through region, the anti-punch through region including fluorine and boron. The method can includes forming a recess in the semiconductor fin by etching the fin, depositing a layer of dielectric material in the recess abutting the anti-punch through region, and removing a portion of the fluorine from the anti-punch through region performing an annealing process on the layer of dielectric material. The method can include removing the layer of dielectric material from the recess and forming a transistor source region in the recess by depositing a semiconductor material in the recess.

In one embodiment, an integrated circuit die includes a semiconductor substrate, a semiconductor fin protruding from the semiconductor substrate, and a channel region in the semiconductor fin. The integrated circuit die 100 can include a gate dielectric positioned on the fin over the channel region and a gate electrode positioned over the gate dielectric. The integrated circuit die can include an anti-punch through region in the semiconductor fin doped with a first dopant type, and a source region in the fin doped with a second dopant type opposite from the first dopant type. An interface between the source region and the anti-punch through region has a roughness less than 1 nm peak to valley.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a semiconductor fin including a channel region and an anti-punch through region;
    forming a recess in the semiconductor fin, the recess having a sidewall abutting the anti-punch through region;
    depositing a layer of dielectric material on the sidewall of the recess;
    performing an annealing process while the layer of dielectric material is on the sidewall of the recess, wherein performing the annealing process includes diffusing a first dopant from the anti-punch through region into the layer of dielectric material;
    removing the layer of dielectric material from the sidewall of the recess; and
    forming a transistor source region in the semiconductor fin by depositing a semiconductor material in the recess.

2. The method of claim 1, wherein performing the annealing process reduces a concentration of the first dopant in the anti-punch through region.

3. The method of claim 2, wherein the first dopant includes fluorine.

4. The method of claim 2, wherein the first dopant includes hydrogen or carbon.

5. The method of claim 2, wherein a concentration of the first dopant in the anti-punch through region after the annealing process is less than $1E4/cm^3$.

6. The method of claim 2, wherein a concentration of a second dopant in the anti-punch through region is greater than $1E15/cm^3$ after performing the annealing process.

7. The method of claim 6, further comprising doping the transistor source region with a third dopant of an opposite type of the second dopant.

8. The method of claim 7, wherein depositing the semiconductor material in the recess includes performing an epitaxial growth.

9. The method of claim 8, wherein doping the transistor source region includes doping the transistor source region in situ during the epitaxial growth.

10. A method, comprising:
    forming a semiconductor fin including a channel region and an anti-punch through region, the anti-punch through region including fluorine and boron;
    forming a recess in the semiconductor fin by etching the fin;

depositing a layer of dielectric material in the recess abutting the anti-punch through region;

removing a portion of the fluorine from the anti-punch through region performing an annealing process on the layer of dielectric material;

removing the layer of dielectric material from the recess; and forming a transistor source region in the recess by depositing a semiconductor material in the recess.

11. The method of claim 10, further comprising doping the source region with N-type dopant.

12. The method of claim 11, wherein the semiconductor material is monocrystalline silicon and the N-type dopant is phosphorus.

13. The method of claim 10, wherein the layer of dielectric material is silicon dioxide.

14. The method of claim 10, wherein a concentration of fluorine in the anti-punch through region after the annealing process is less than 1E3/cm^3.

15. The method of claim 10, wherein the annealing process is a rapid thermal annealing process.

16. A method, comprising:

forming a semiconductor fin including a first anti-punch through region of a first conductivity type and a first channel region of a first transistor of a second conductivity type on the first anti-punch through region;

forming a first recess in the fin exposing a sidewall of the first anti-punch through region and a sidewall of the first channel region;

forming a first dielectric layer in the recess on the sidewall of the first anti-punch through region;

drawing first dopant atoms from the first anti-punch through region into the first dielectric layer by performing a first thermal annealing process while the first dielectric layer is on the sidewall of the first anti-punch through region;

removing the first dielectric layer after performing the first thermal annealing process; and forming a first source region of the first transistor in the first recess in contact with the first anti-punch through region and having the second conductivity type.

17. The method of claim 16, wherein the semiconductor fin includes a second anti-punch through region of the second conductivity type and a second channel region of a second transistor of the first conductivity type on the second anti-punch through region; forming a second recess in the tin exposing a sidewall of the second anti-punch through region and a sidewall of the second channel region; forming a second dielectric layer in the recess on the sidewall of the second anti-punch through region; drawing second dopant atoms from the second anti-punch through region into the second dielectric layer by performing a second thermal annealing process while the second dielectric layer is on the sidewall of the second anti-punch through region; removing the second dielectric layer after performing the second thermal annealing process; and forming a second source region of the second transistor in the second recess in contact with the second anti-punch through region and having of the first conductivity type.

18. The method of claim 16, wherein the first conductivity type is N-type and the second conductivity type is N-type.

19. The method of claim 17, wherein the first dopant atoms include hydrogen atoms, wherein the second dopant atoms include fluorine atoms.

* * * * *